United States Patent
Tsukada et al.

(10) Patent No.: US 6,809,415 B2
(45) Date of Patent: Oct. 26, 2004

(54) PRINTED-CIRCUIT BOARD AND METHOD OF MANUFACTURE THEREOF

(75) Inventors: Kiyotaka Tsukada, Ogaki (JP); Mitsuhiro Kondo, Ogaki (JP); Kenji Chihara, Ogaki (JP); Naoto Ishida, Ogaki (JP); Atsushi Shouda, Ogaki (JP)

(73) Assignee: Ibiden Co., Ltd., Ogaki (JP)

(*) Notice: Subject to any disclaimer, the term of this patent is extended or adjusted under 35 U.S.C. 154(b) by 0 days.

(21) Appl. No.: 09/740,424

(22) Filed: Dec. 19, 2000

(65) Prior Publication Data

US 2001/0002728 A1 Jun. 7, 2001

(30) Foreign Application Priority Data

Jul. 22, 1998 (JP) .......................................... 10-206189

(51) Int. Cl.[7] ............................................. H01L 23/48
(52) U.S. Cl. ...................... 257/693; 257/737; 257/738; 257/780; 257/786; 438/106; 174/257; 174/260; 361/767; 361/768; 361/783; 228/180.22
(58) Field of Search ................................ 257/737–739, 257/778–786, 693; 438/106; 174/257, 260; 361/767, 768, 783; 228/180.22

(56) References Cited

U.S. PATENT DOCUMENTS

| | | | | |
|---|---|---|---|---|
| 4,289,834 A | * | 9/1981 | Alcorn et al. ................. 428/601 |
| 5,207,103 A | * | 5/1993 | Wise et al. .................... 73/724 |
| 5,316,788 A | | 5/1994 | Dibble et al. ................. 427/98 |
| 5,609,704 A | * | 3/1997 | Hayama et al. ........... 156/89.16 |
| 5,634,268 A | * | 6/1997 | Dalal et al. ................... 29/840 |
| 5,656,550 A | * | 8/1997 | Tsuji et al. .................. 438/123 |
| 5,672,260 A | * | 9/1997 | Carey et al. ................. 205/118 |
| 5,838,160 A | * | 11/1998 | Beaman et al. .............. 324/754 |
| 5,872,399 A | * | 2/1999 | Lee .............................. 257/738 |
| 5,886,877 A | * | 3/1999 | Shingai et al. .............. 361/768 |
| 5,929,521 A | | 7/1999 | Wark et al. .................. 257/737 |
| 5,949,412 A | | 9/1999 | Huntsman .................... 345/740 |
| 6,228,466 B1 | * | 5/2001 | Tsukada et al. ............. 428/209 |
| 6,335,571 B1 | * | 1/2002 | Capote et al. ............... 257/787 |
| 6,573,598 B2 | * | 6/2003 | Ohuchi et al. .............. 257/734 |

FOREIGN PATENT DOCUMENTS

| | | | |
|---|---|---|---|
| JP | 60-234982 | | 11/1985 |
| JP | 62092453 A | * | 4/1987 |
| JP | 01175729 A | * | 7/1989 |
| JP | 1-238132 | | 9/1989 |
| JP | 03153049 A | * | 7/1991 |
| JP | 3-291950 | | 12/1991 |
| JP | 4-348587 | | 12/1992 |
| JP | 5-029363 | | 2/1993 |
| JP | 5-327179 | | 12/1993 |
| JP | 8-181423 | | 7/1996 |
| JP | 11054896 A | * | 2/1999 .......... H05K/03/34 |

* cited by examiner

*Primary Examiner*—Tom Thomas
*Assistant Examiner*—Chris C. Chu
(74) *Attorney, Agent, or Firm*—Godfrey & Kahn, S.C.

(57) ABSTRACT

A printed circuit board 1 providing superior adhesion between a substrate 2 and a conductor pattern 3 and preventing damage of the substrate 2. The width c of the bottom surface 310 of the conductor pattern 3 is greater than the width d of the top surface 320. Accordingly, the conductor pattern 3 has a trapezoidal cross-section. The two side surfaces 315 of a lower portion 31 of the conductor pattern 3 are coated by a solder resist. The two side surfaces 325 at the upper portion 32 of the conductor pattern 3 are exposed from the solder resist 4. A solder ball 6 engages the two side surfaces 325.

11 Claims, 8 Drawing Sheets

PRINTED-CIRCUIT BOARD AND METHOD OF MANUFACTURE THEREOF

BACKGROUND OF THE INVENTION

The present invention relates to a printed circuit board and a method of manufacturing same, and more particularly, to a printed circuit board provided with a conductor pattern having superior adhesion and a method of manufacturing same.

A prior art printed circuit board 9 is shown in FIG. 5(A). The printed circuit board 9 includes an insulative substrate 2, a plurality of conductor patterns 93, and an insulative protection film 94 coating the substrate 2 and the patterns 93. The conductor patterns 93 function as wiring and external terminals. The bottom surfaces 931 of the conductor patterns 93 are adhered to the upper surface of the substrate 2. The width a of the bottom surface 931 is equal to the width b of the top surface 932 of the conductor pattern 93. In other words, the conductor patterns 93 have rectangular cross-sections. The side surfaces 935 of the conductor patterns 93 are completely coated by the protection film 94. The conductor patterns 93 are formed after forming the protection film 94 on the substrate 2.

Since the conventional conductor patterns 93 have a rectangular cross-section in which the width a of the bottom surface 931 is equal to the width b of the top surface 932, the area of contact between the conductor patterns 93 and the substrate 2 is relatively small. Hence, the adhesion between the substrate 2 and the conductor patterns 93 is relatively weak. Accordingly, as shown in FIG. 5(B), when an external force, such as thermal stress, is applied to the printed circuit board 9, the conductor patterns 93 may be separated from the upper surface of the substrate 2.

To solve this problem, as shown in FIG. 6(A), the conductor patterns 93 may have a trapezoid cross-section in which the width a of the bottom surface 931 is greater than the width b of the top surface 932. However, in this case, the material forming the conductor patterns 93 forces the protection film 94, which is shaped in correspondence with the conductor patters 93, upward. Thus, as shown in FIG. 6(B), the protection film 94 may be separated from the upper surface of the substrate 2. Further, as shown in FIG. 6(C), during formation of the conductor patterns 93, a portion 939 of the conductor patterns 93 may enter the space between the bottom surface of the protection film 94 and the upper surface of the substrate 2 causing a short-circuit with the adjacent conductor pattern 93.

Further, as shown in FIG. 7(A), in the conventional printed circuit board 9, the side surfaces 935 of the conductor pattern 93 are completely coated by the protection film 94. Thus, for example, when a connection terminal plating 95 and a solder ball 96 are joined to the conductor pattern 93, the solder ball 96 is riot hooked to the side surfaces 935 of the conductor pattern 93. Accordingly, if a lateral force, such as that indicated by an arrow, is applied to the solder ball 96, the solder ball 96 may be separated from the conductor pattern 93.

To solve this problem, as shown in FIG. 7(B), the side surfaces 935 of the conductor pattern 93 may be completely exposed to allow the solder ball 96 to enter the space between the side surfaces 935 of the conductor pattern 93 and the protection film 94. However, in this case, the solder ball 96 contacts the substrate 2, which mechanical strength is relatively weak. Due to the surface tension of the solder ball, the area of the contact portion between the solder ball 96 and the substrate 2 is relatively small. Therefore, when a lateral force, such as that indicated by the arrow, is applied to the solder ball 96, the force is locally applied to the contact portion of the substrate 2. As a result, a crack 99 may be produced in the substrate 2, and the substrate 2 may be damaged.

SUMMARY OF THE INVENTION

It is an object of the present invention to provide a printed circuit board and its manufacturing method that provides strong adhesion between a substrate and a conductor pattern and prevents damage of the substrate.

To achieve the above object, a first aspect of the present invention provides a printed circuit board including a substrate, a conductor pattern formed on the substrate, and a protection film coating the substrate and the conductor pattern. The conductor pattern includes a bottom surface contacting the substrate, a top surface opposite to the bottom surface, and a pair of side surfaces. Each of the side surfaces have a lower side surface covered by the protection film and an upper side surface exposed from the protection film. The width of the bottom surface is greater than the width of the top surface.

It is preferred that the width of the bottom surface of the conductor pattern be greater than the width of the top surface, the lower side surface be coated by the protection film, and the upper side surface be exposed from the protection film.

In the printed circuit board according to a first aspect of the present invention, the width of the bottom surface of the conductor pattern is greater than the width of the top surface, and the area of the portion adhered to the substrate is relatively large. Accordingly, in comparison with a conductor pattern having a rectangular cross-section, the adhesion between the substrate and the conductor pattern is stronger. Thus, separation of the conductor pattern from the upper surface of the substrate is prevented.

The upper side surfaces of the conductor pattern are exposed from the protection film. Thus, when joining, for example, a solder ball, to the conductor pattern, the solder ball enters the upper side surfaces of the conductor pattern. Thus, even if a lateral force is applied to the solder ball subsequent to the joining, the solder ball has a portion hooked to the side surfaces thereby preventing the solder ball from being separated from the conductor pattern.

Further, the lower side surface of the conductor pattern is coated by the protection film. Accordingly, for example, the solder ball contacts the conductor pattern, which mechanical strength is greater than that of the substrate, without contacting the substrate. Thus, even if a lateral force is applied to the solder ball subsequent to the joining, the force acts on the conductor pattern and not on the substrate thereby preventing damages, such as cracking, of the substrate.

It is preferred that the top surface of the conductor pattern be coated by a plating. In this case, the solder ball is easily joined to the conductor pattern.

It is preferred that the solder ball contact the conductor pattern at the upper side surfaces of the conductor pattern. In this case, even if a lateral force is applied to the joined solder ball, the solder ball is in contact with the side surfaces of the conductor pattern and thus separation of the solder ball from the conductor pattern is prevented.

A second aspect of the present invention provides a method for fabricating a printed circuit board. The method includes the steps of etching a substrate including a conductor to form a conductor pattern, applying an insulative protection film to the conductor pattern and the substrate, and removing part of the protection film. In the etching step, the conductor pattern is formed so that a width of a bottom surface contacting the substrate is greater than a width of a top surface, which is opposite the bottom surface. In the etching step, an upper portion of the conductor pattern is exposed.

The conductor pattern is formed before the protection film. Accordingly, the protection film does not exist when the conductor pattern is formed. Thus, the conductor pattern does not force the protection film upward. Further, part of the conductor pattern does not enter the space between the bottom surface of the protection film and the top surface of the substrate. As a result, short-circuiting between adjacent conductor patterns is prevented.

DETAILED DESCRIPTION OF THE INVENTION

Figure 1:
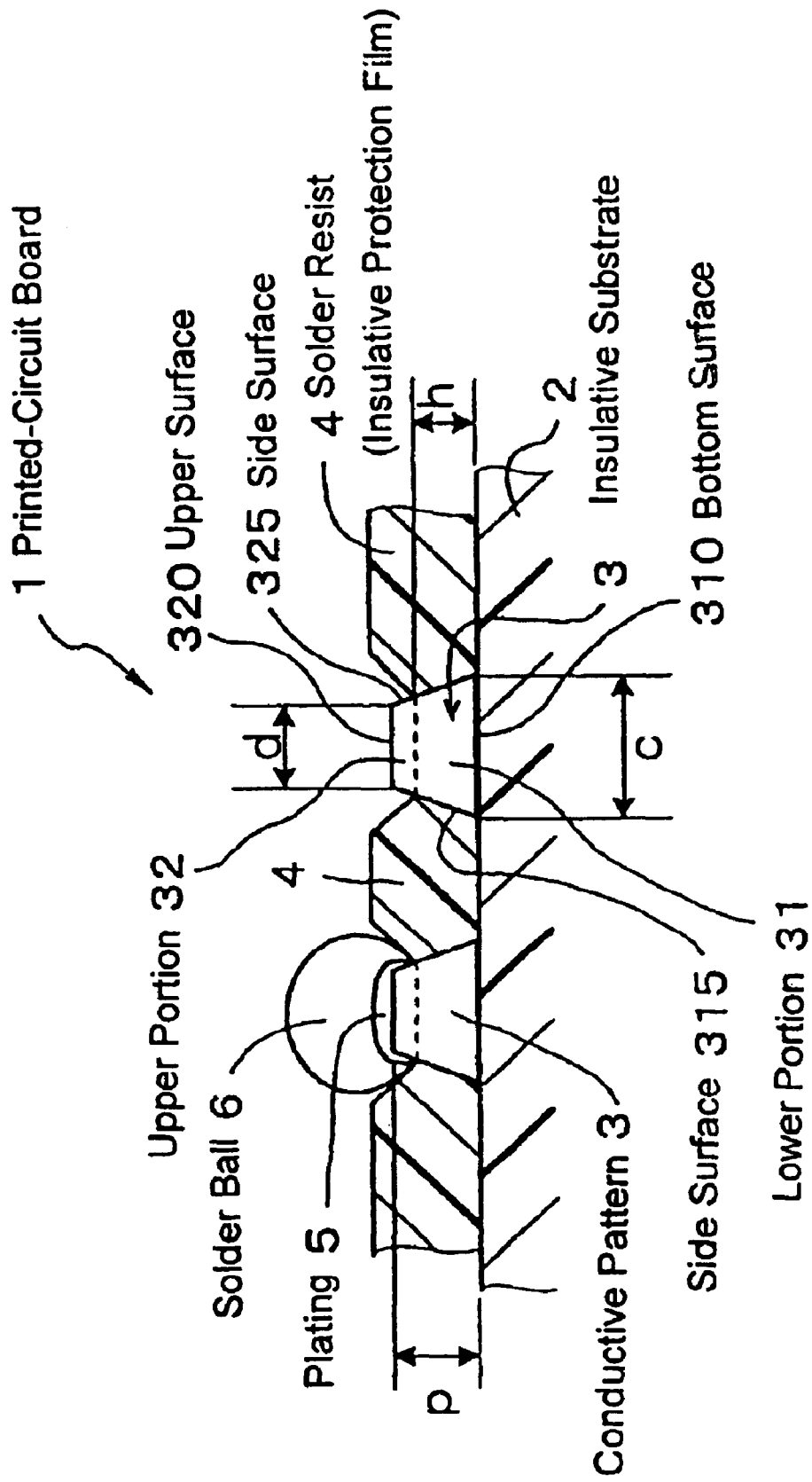
FIG. 1 is an enlarged, partial cross-sectional view showing a printed circuit board according to a first embodiment of the present invention.

A printed circuit board according to a first embodiment of the present invention will now be described with reference to FIGS. 1 and 2.

The printed circuit board 1 includes a insulative substrate 2, a conductor pattern 3 formed on the substrate 2, and an insulative protection film, or solder resist 4, for coating the substrate 2 and the conductor pattern 3. The conductor pattern 3 extends perpendicular to the plane of the drawing. As shown in FIG. 1, the conductor pattern 3 includes an upper portion 32 and a lower portion 31. The bottom surface 310 of the conductor pattern 3 is adhered to the upper surface of the substrate 2. The width c of the bottom surface 310 is greater than the width d of the top surface 320. Accordingly, the conductor pattern 3 has a trapezoidal cross-section, which is perpendicular to the longitudinal direction. The side surfaces 315 of the lower portion 31 are coated by the solder resist 4. On the other hand, the side surfaces 325 of the upper portion 32 are not coated by the solder resist 4. The height h of the lower portion 31 is about 95% of the conductor pattern height p. The remaining 5% of the conductor pattern height p is the height of the upper portion 32. The top surface 320 of the upper portion 32 and the side surfaces 325 are coated by a connection terminal plating 5. Further, a solder ball 6 is connected to the conductor pattern 3 by the plating 5. The solder ball 6 engages the side surfaces 325 of the upper portion 32.

A method for fabricating the printed circuit board 1 will now be described with reference to FIGS. 2(A) to 2(E). It is preferred that glass epoxy be used as the material of the substrate 2. The printed circuit board 1 is fabricated from a copperclad laminate, which is produced by cladding a copper foil on the substrate 2.

First, in FIG. 2(A), the copperclad laminate undergoes etching to form a plurality of conductor patterns 3 on the substrate 2. During the etching treatment, the conductor pattern 3 is formed so that its cross-section is a trapezoid, which width c of the bottom surface 310 is greater than the width d of the top surface 320. It is preferred that the width c of the bottom surface 310 be 30 to 200 $\mu$m and the width d of the top surface 320 be 10 to 180 $\mu$m. In the first embodiment, the width c of the bottom surface 310 is 80 $\mu$m, the width d of the top surface 320 is 70 $\mu$m, and the height p of the conductor pattern 3 is 35 $\mu$m.

As shown in FIG. 2(B), the solder resist 4 is applied so as to entirely cover the conductor patterns 3 and the substrate 2. When doing so, the solder resist 4 is applied so that the height of the solder resist 4 is generally constant, or such that its surface 41 is flat.

A laser is irradiated against the upper surface 41 of the solder resist 4 to remove the solder resist 4 along the conductor pattern 3, as shown in FIG. 2(C). The laser irradiation is stopped when 5% of the height p of the conductor pattern 3 is exposed. The laser irradiation exposes the upper portion 32, or the top surface 320 and the upper side surfaces 325, from openings 40 of the solder resist 4. In this state, the height h of the lower portion 31 of the conductor pattern 3 is about 33 $\mu$m.

As shown in FIG. 2(D), a plating treatment is performed on predetermined conductor patterns 3. During the plating treatment, the upper portion 32 of the predetermined conductor patterns 3 is coated by the connection terminal plating 3. Metal, such as copper, gold, or nickel is used as the material of the plating 5.

Then, solder is arranged on the plating 5, and the solder is heated and melted. When the melted solder hardens, the solder ball 6 is joined to the upper portion 32 of the conductor pattern 3 by way of the plating 5, as shown in FIG. 2(E). In this state, the solder ball 6 has engaging portions 63, which are hooked to the two side surfaces 325 of the upper portion 32.

Figure 8:
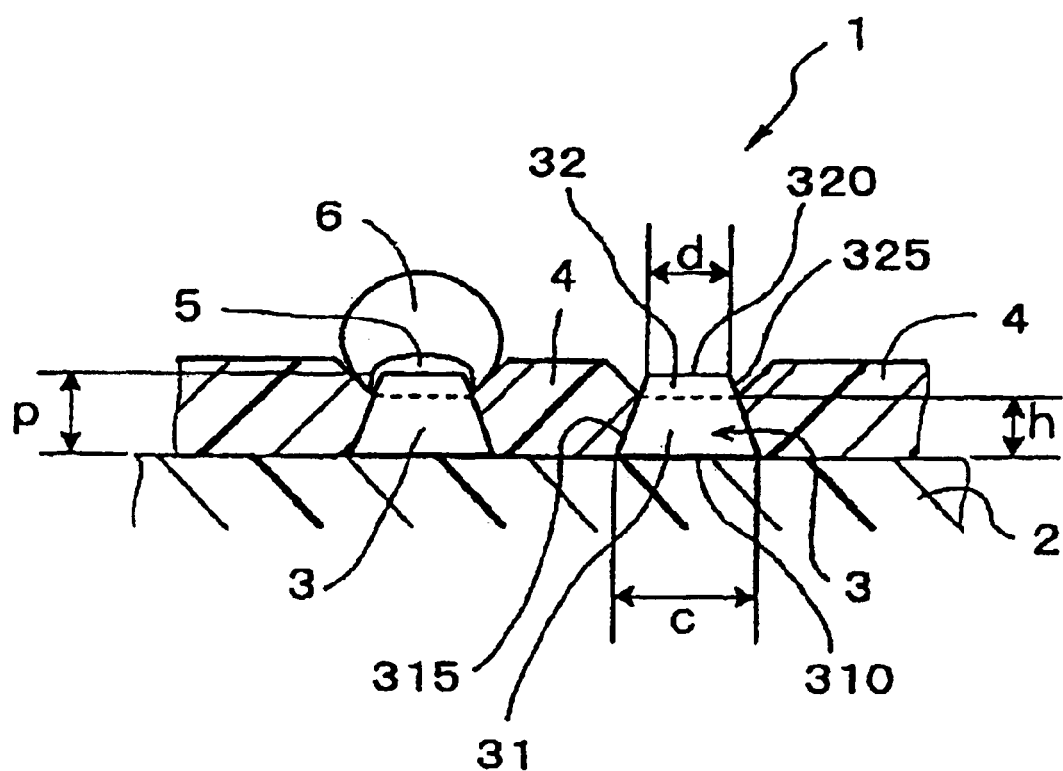
FIG. 8 is a cross-sectional view showing a printed circuit board according to another embodiment of the present invention.

During the plating treatment, it is preferred that the uppermost portion of the plating 5 be formed at a position higher than the upper surface 41 of the solder resist 4 as shown in FIG. 8. This enables the joining of, for example, a solder ball or a solder paste to be performed more easily.

Further, when electrically testing the printed circuit board 1, the terminal used during the testing, for example, a probe or an anisotropic conductive rubber body, easily contacts the plating 5. If the uppermost portion of the plating 5 is formed at a position lower than the upper surface 41 of the solder resist 4, the joining and contacting may be difficult.

It is preferred that the height h of the lower portion 31 be 50% or greater and less than 100% of the height p of the conductor pattern 3. In this case, the coating of the side surfaces 315 of the lower portion 31 by the solder resist 4 is ensured. When the height h of the lower portion 31 is less than 50% of the height p of the conductor pattern 3, the coating of the side surfaces 315 of the lower portion 31 is not ensured. Thus, for example, a lateral force applied to the solder ball 6, which is joined with the conductor patterns 3, would easily be transmitted to the substrate 2, which is located below the lower portion 31, and may inflict damage, such as cracking of the substrate 2. On the other hand, if the height h of the lower portion is 100% of the height p of the conductor pattern 3, this would eliminate the upper portion 32 of the conductor pattern 3. In this case, the strength joining the solder ball 6 with the conductor pattern 3 would not be sufficient.

It is preferred that the cross-sectional shape of the conductor pattern 3 be an isosceles trapezoid, which left and right sides are equal to facilitate fabrication.

It is preferred that the value obtained by dividing one half of the difference between the bottom surface width and the top surface width by the height of the conductor pattern $3\{(c-d)/2\}/p$ (hereafter referred to as value X) be within the range of 0.1 to 2.5. When the dimensions of the conductor pattern 3 are in such range, the contact area between the side surfaces 315 of the lower portion 31 and the solder resist 4 increases. As a result, the solder resist 4 presses the conductor pattern 3 against the substrate 2. If the value X is lower than 0.1, the contact area between the side surfaces 315 of the lower portion 31 and the solder resist 4 decreases. Thus, the conductor pattern 3 may not be pressed sufficiently against the substrate 2 by the solder resist 4. If the value X is greater than 2.5, the exposed portion of the conductor pattern 3 decreases. This decreases the connection area between the conductor pattern 3 and semiconductor components. As a result, the connection strength of the semiconductor components may decrease.

The printed circuit board 1 of the first embodiment has the advantages described below.

Figure 2:
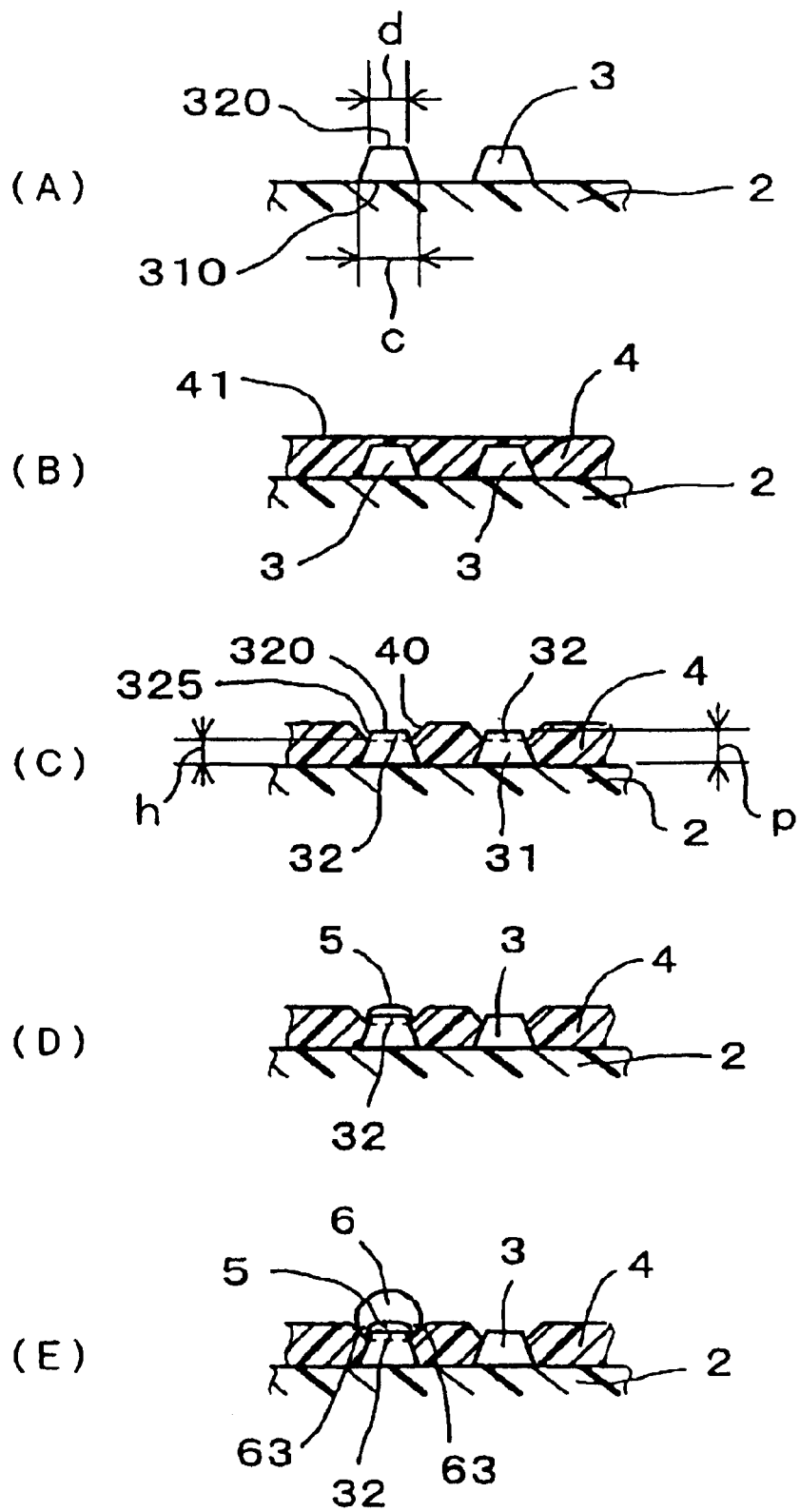
FIGS. 2(A) to 2(E) are partial cross-sectional diagrams showing procedures for fabricating the printed circuit board of the first embodiment.

As shown in FIG. 1, in the printed circuit board 1 of the first embodiment, the width c of the bottom surface 310 is greater than the width d of the top surface 320 of the upper portion 32. In other words, the conductor pattern 3 has a trapezoidal cross-section. Accordingly, in comparison to the conventional conductor pattern 93, which cross-section is rectangular, a relatively large area of the conductor pattern 3 is adhered to the substrate 2. This shape increases the adhesion of the conductor pattern 3 to the substrate 2. As a result, separation of the conductor pattern 3 from the upper surface of the substrate 2 is prevented.

As shown in FIG. 2(A), the conductor pattern 3 is formed before formation of the solder resist 4. Accordingly, the conductor pattern 3 does not force the solder resist 4 upward like in the prior art examples. Thus, separation of the solder resist 4 from the substrate 2 is prevented. Further, part of the conductor pattern 3 does not enter the space between the bottom surface of the solder resist 4 and the upper surface of the substrate 2. This prevents short-circuiting between adjacent conductor patterns.

The side surfaces 325 of the upper portion 32 are not covered by the solder resist 4. This enables the solder ball 6 to contact the side surfaces 325. Further, the solder ball 6 includes engaging portions 63 that are hooked to the side surfaces 325 of the upper portion 32. Thus, separation of the solder ball 6 from the conductor pattern 3 is prevented even if a lateral force is applied to the solder ball 6.

The side surfaces 315 of the lower portion 31 are coated by the solder resist 4. Thus, the solder ball 6 does not contact the substrate 2 but contacts the conductor pattern 3, which mechanical strength is greater than the substrate 2. Accordingly, even if a lateral force is applied to the solder ball 6 subsequent to joining, the force acts on the conductor pattern 3 and not the substrate 2. This prevents damage, such as cracking, from being inflicted on the substrate 2.

The cross-section of the conductor pattern 3 is substantially an isosceles trapezoid. Thus, the conductor pattern 3 can be formed easily.

The value $X=\{(c-d)/2\}/p$, which is obtained by diving one half of the difference between the width c of the bottom surface 310 and the width d of the top surface 320 by the height p of the conductor pattern 3 is about 0.14. In the conductor pattern 3, which has such dimension, a large area of the solder resist 4 contacts the side surfaces 315 of the lower portion 31. Accordingly, the conductor pattern 3 is rigidly held by the solder resist 4. This further increases the adhesion of the conductor pattern 3 to the substrate 2.

The side surfaces 315, 325 of the conductor pattern 3 are not required to be flat like in the first embodiment and may be curved in a concave manner.

Since the height h of the lower portion 31 is 95% the height p of the conductor pattern 3, the coating of the side surfaces 315 of the lower portion 31 by the solder resist 4 is ensured. Thus, even if a lateral force is applied to the solder ball 6, which is joined to the conductor pattern 3, the prevention of damage of the substrate 2 is ensured.

The upper portion 32 is coated by the plating 5. This facilitates the joining of the solder ball 6 to the conductor pattern 3.

Figure 3:
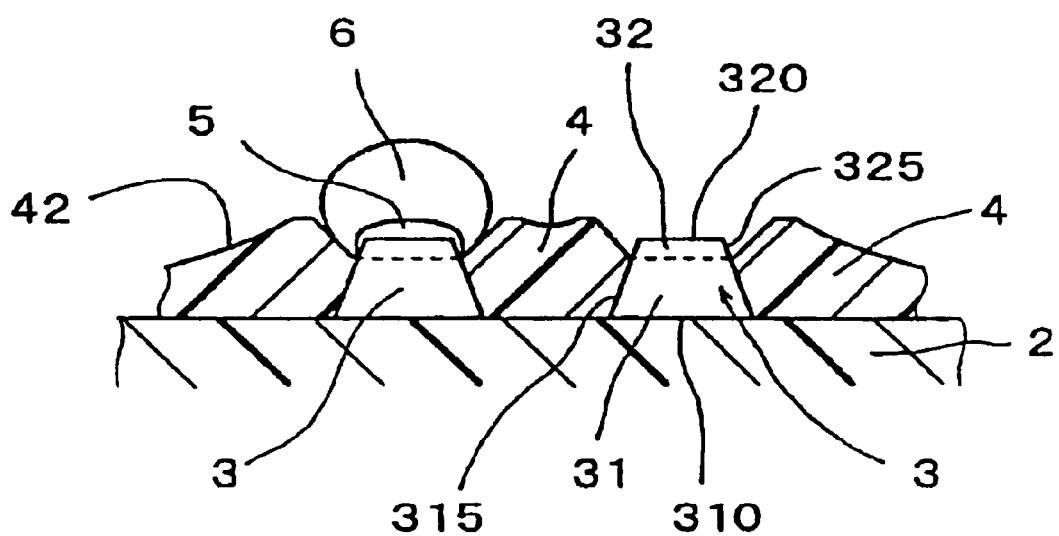
FIG. 3 is an enlarged, partial cross-sectional view showing a printed circuit board according to a second embodiment.

A second embodiment of a printed circuit board will now be discussed centering on the points differing from the first embodiment. As shown in FIG. 3, in the second embodiment, an upper surface 42 of the solder resist 4 is shaped in correspondence with the arrangement of the conductor pattern 3. This is the only difference between the printed circuit boards of the second embodiment and the first embodiment.

The method for fabricating the printed circuit board of the second embodiment will now be discussed.

Figure 4:
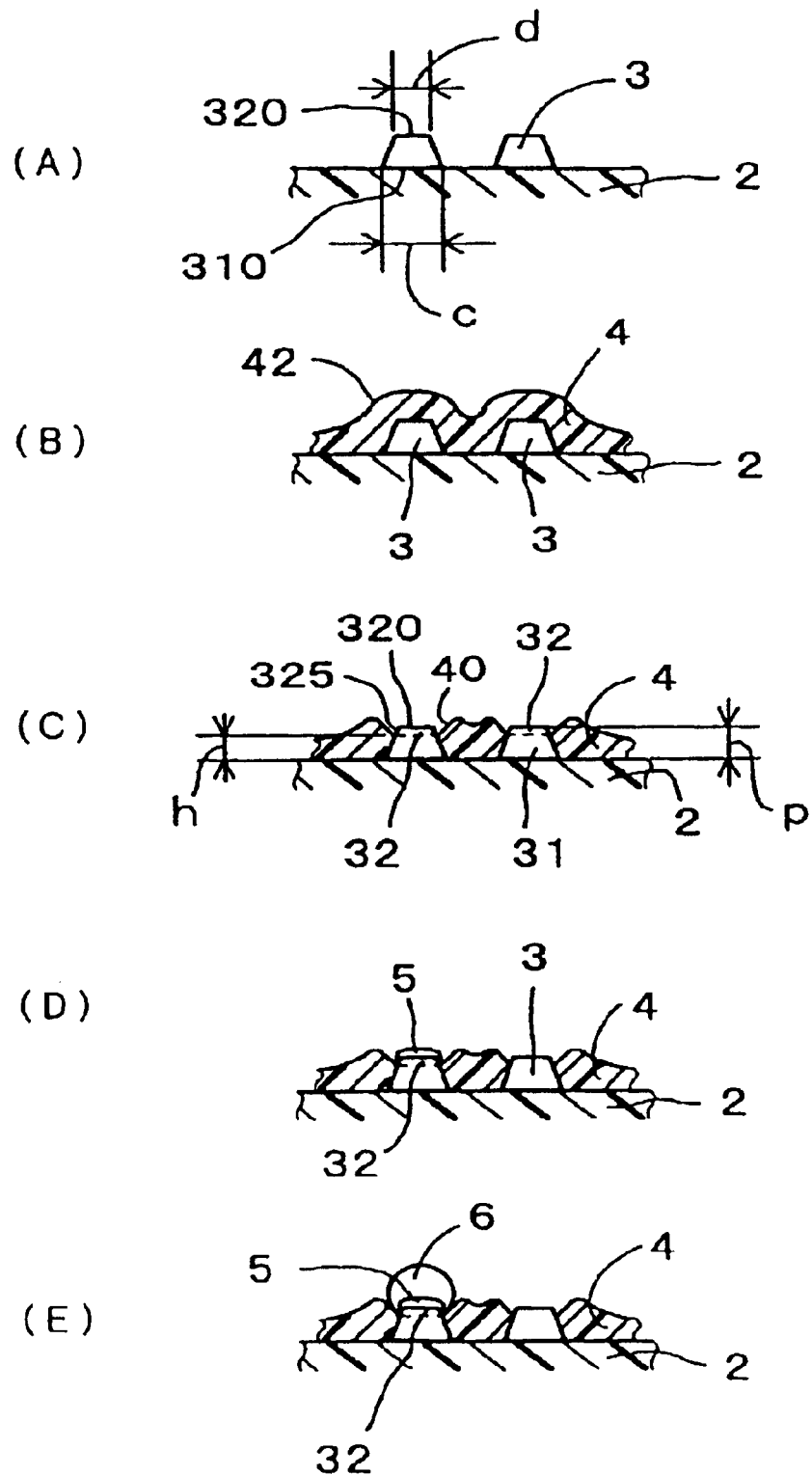
FIGS. 4(A) to 4(E) are partial cross-sectional diagrams showing procedures for fabricating the printed circuit board of FIG. 3.
Figure 5:
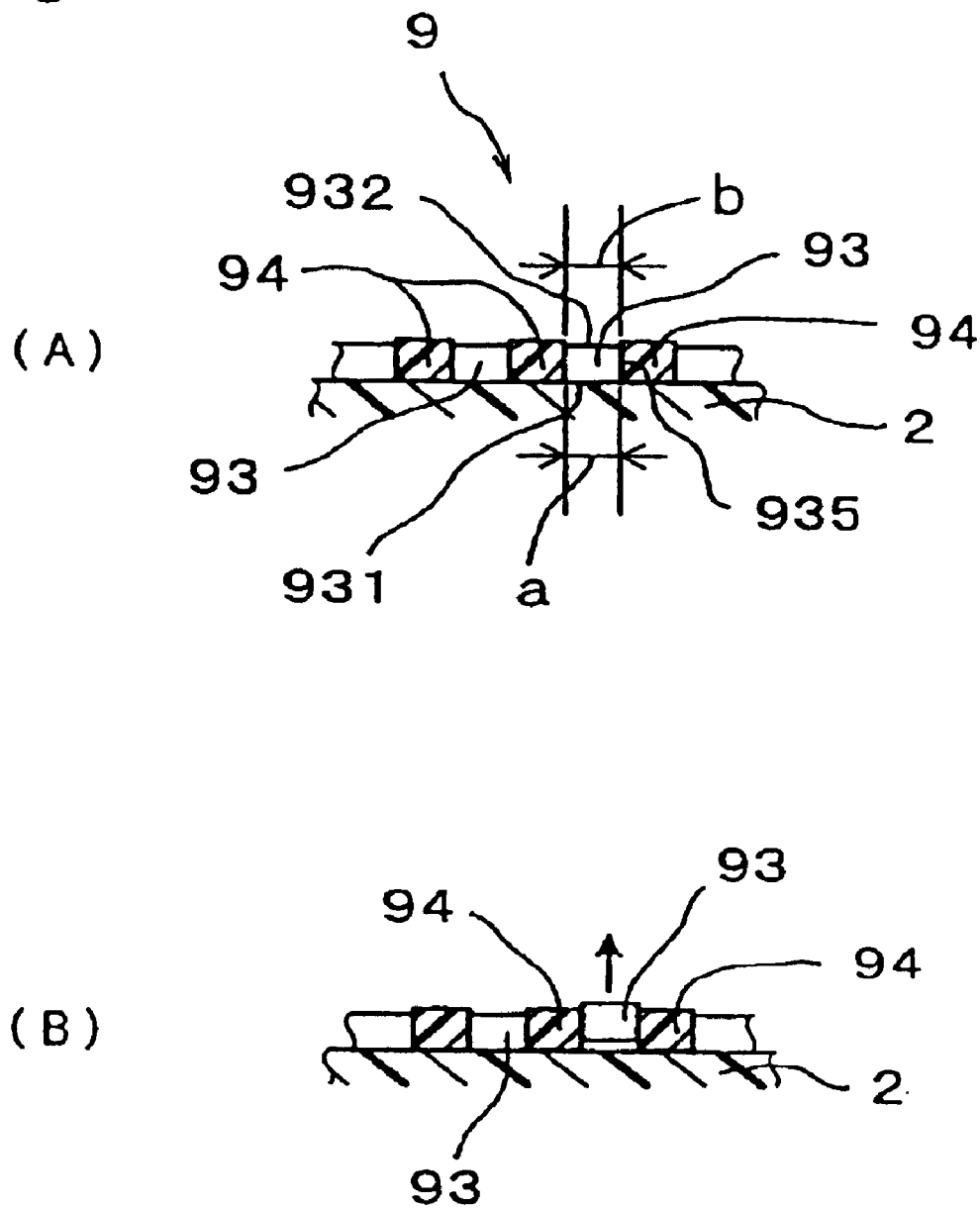
FIG. 5(A) is a partial cross-sectional view showing a first prior art example of a printed circuit board.
FIG. 5(B) is a partial cross-sectional diagram showing the printed circuit board of FIG. 5(A) in a state in which the conductor pattern is separated from the printed circuit board.
Figure 6:
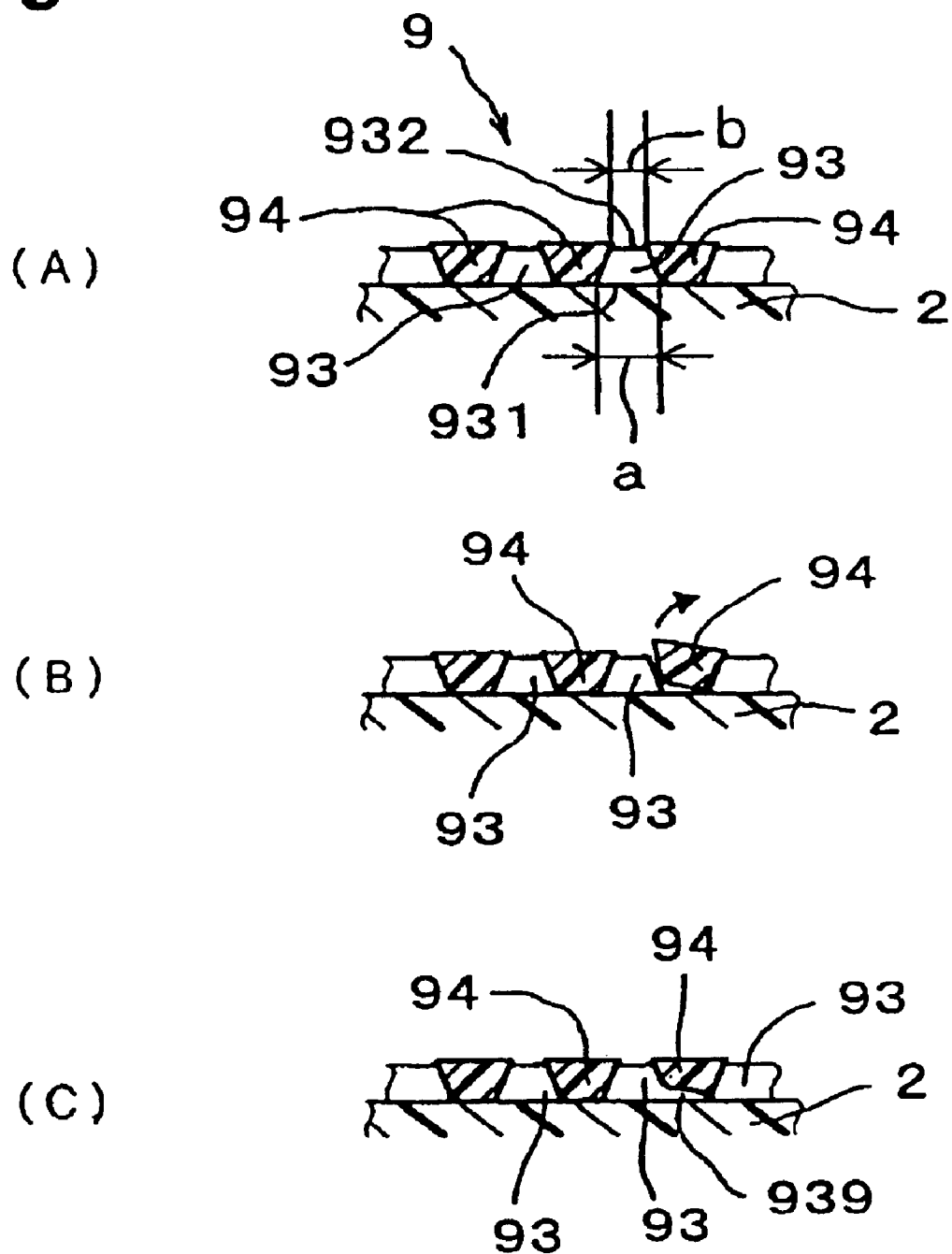
FIG. 6(A) is a partial cross-sectional view showing a second prior art example of the printed circuit board.
FIG. 6(B) is a partial cross-sectional diagram showing a state in which a solder resist is separated from the printed circuit board of FIG. 6(A).
FIG. 6(C) is a partial cross-sectional diagram showing a state in which the conductor pattern is separated in the printed circuit board of FIG. 6(A).
Figure 7:
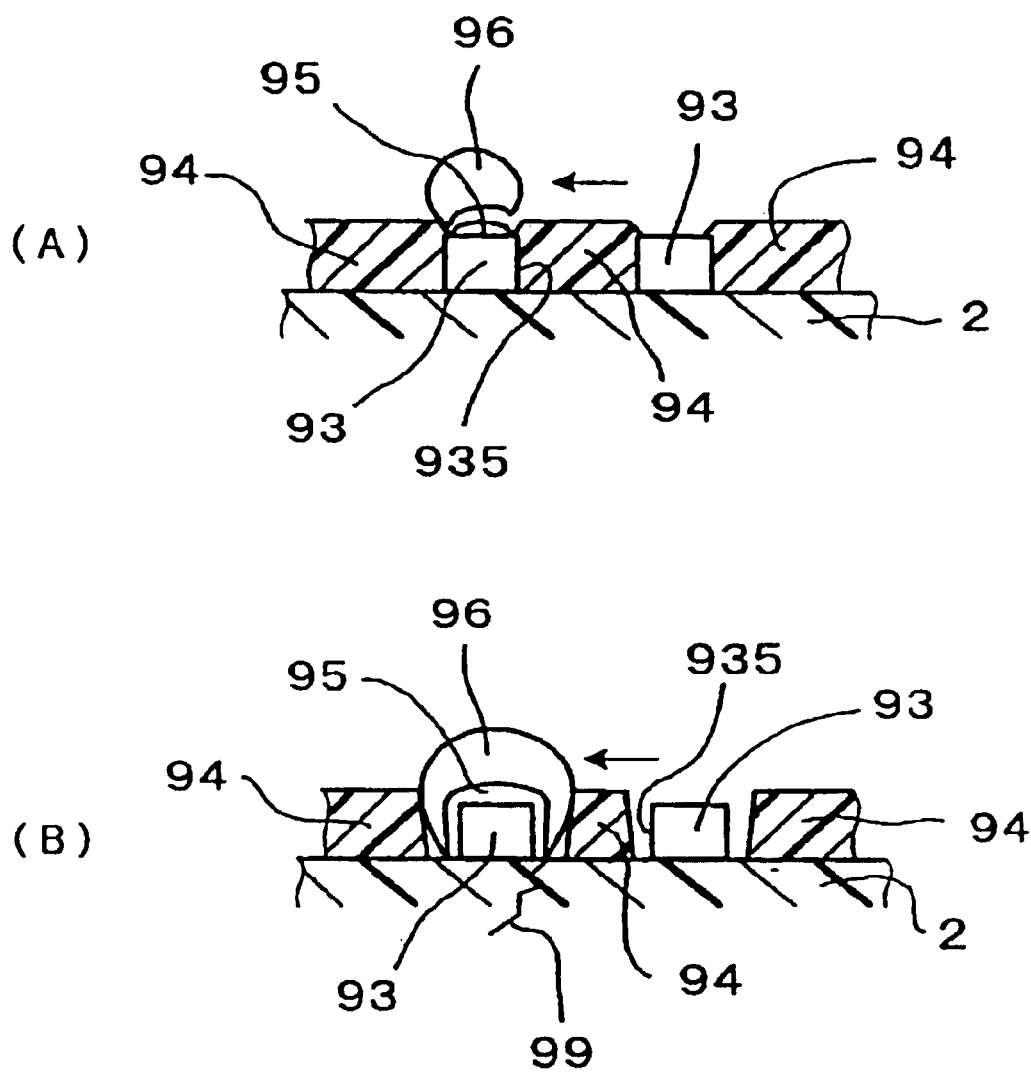
FIG. 7(A) is an enlarged, partial cross-sectional diagram showing a state in which a solder ball is separated from a third prior art example of a printed circuit board.
FIG. 7(B) is a partial cross-sectional diagram showing a state in which a substrate is cracked in a fourth prior art example of a printed board circuit.

As shown in FIG. 4(A), a plurality of conductor patterns 3 are formed on the substrate 2 by performing etching, or the like, on a copperclad laminate. The width c of the bottom surface 310 of each conductor pattern 3 is greater than the width d of its top surface 320. Accordingly, each conductor pattern 3 has a trapezoidal cross-section.

Then, as shown in FIG. 4(B), a solder resist 4, which serves as an insulative protection film, is applied to the entire surfaces of the conductor patterns 3 and the substrate 2. When doing so, the solder resist 4 is applied so that its thickness is substantially uniform. Thus, the upper surface 42 of the solder resist 4 is corrugated in accordance with the arrangement of the conductor pattern 3.

A laser is irradiated against the upper surface 42 of the solder resist 4 to remove the solder resist 4 along the conductor patterns 3, as shown in FIG. 4(C). Laser irradiation is stopped when 5% of the height p of the conductor pattern 3 is exposed. This exposes the upper portion 32 of the conductor pattern 3, or the top surface 320 and the side surfaces 325 to openings 40 of the solder resist 4. In this state, the height h of the lower portion 31 of the conductor pattern 3 is 95% of the height p of the conductor pattern 3.

As shown in FIG. 4(D), a plating treatment is performed on predetermined conductor patterns 3. During the plating treatment, the upper portions 32 of the predetermined conductor patterns 3 are coated by the connection terminal plating 3.

Then, solder is arranged on the plating 5, heated, and melted. When the melted solder hardens, the solder ball 6 is joined to the upper portion 32 of the conductor patterns 3 by way of the plating 5, as shown in FIG. 4(E).

The second embodiment has the same advantages as the first embodiment.

Accordingly, the present invention provides a printed circuit board having superior adhesion between the substrate and the conductor pattern and preventing damage of the substrate.

What is claimed is:

1. A printed circuit board comprising:
    an insulative substrate;
    a conductor pattern formed on the substrate;
    a protection film coating the substrate and the conductor pattern, wherein the conductor pattern includes a bottom surface directly contacting the substrate, a top surface opposite to the bottom surface, and a pair of flat angled side surfaces extending from the bottom surface to the top surface, each of the side surfaces having a lower portion covered by the protection film and an upper portion exposed from the protection film, wherein both the bottom surface and the top surface have widths, the lower portion of each side surface covered by the protection film and the conductor pattern have heights, and wherein the width of the bottom surface is greater than the width of the top surface; and
    a plating for coating the top surface and the upper portion of the side surfaces of the conductor pattern, wherein the plating has an uppermost portion located at a position higher than a portion of the upper surface of the protection film.

2. The printed circuit board according to claim 1, wherein the conductor pattern has a trapezoidal cross-section.

3. The printed circuit board according to claim 1, wherein the height of the lower portion of each side surface covered by the protection film in the conductor pattern is 50% or greater and less than 100% of the height of the conductor pattern.

4. The printed circuit board according to claim 1, further comprising a solder ball contacting the plating at the upper-portion of the side surfaces.

5. The printed circuit board according to claim 1, wherein a value X is obtained by the following formula:

$$X=((c-d)/2)/p$$

where c is the width of the bottom surface, d is the width of the top surface, and p is the height of the conductor pattern, and wherein X is in the range of 0.1 to 2.5.

6. The printed circuit board according to claim 1, wherein the material of the plating is one of copper, gold, and nickel.

7. The printed circuit board according to claim 1, wherein engaging grooves are formed between the conductor pattern and the protective film.

8. A method for fabricating a printed circuit board comprising the steps of:
    etching an insulative substrate including a conductor to form a conductor pattern having a bottom surface directly contacting the substrate, a top surface opposite to the bottom surface, and a pair of flat angled side surfaces extending from the bottom surface to the top surface, wherein the conductor pattern is formed so that a width of the bottom surface is greater than a width of the top surface;
    applying an insulative protection film to the conductor pattern and the substrate;
    removing a portion of the protection film to expose the top surface and an upper portion of each of the side surfaces; and
    forming a plating on the exposed top surface and the upper portion of the side surfaces of the conductor pattern, the plating having an uppermost portion located at a position higher than a portion of the upper surface of the protection film.

9. The method according to claim 8, further comprising:
    joining a solder ball to the plated top surface and upper portion of the side surfaces of the conductor pattern.

10. The method according to claim 9, wherein the material of the plating is one of copper, gold, and nickel.

11. The method according to claim 8, wherein the step of removing a portion of the protection film includes forming engaging grooves between the conductor pattern and the protective film.

\* \* \* \* \*